United States Patent [19]

Okumura et al.

[11] Patent Number: 5,404,042
[45] Date of Patent: Apr. 4, 1995

[54] SEMICONDUCTOR MEMORY DEVICE HAVING A PLURALITY OF WELL REGIONS OF DIFFERENT CONDUCTIVITIES

[75] Inventors: Yoshinori Okumura; Tomonori Okudaira; Hideaki Arima, all of Hyogo, Japan

[73] Assignee: Mitsubishi Denki Kabushiki Kaisha, Tokyo, Japan

[21] Appl. No.: 71,925

[22] Filed: Jun. 4, 1993

Related U.S. Application Data

[63] Continuation of Ser. No. 693,304, Apr. 30, 1991, abandoned.

[30] Foreign Application Priority Data

May 2, 1990 [JP] Japan .................................. 2-116275
Mar. 18, 1991 [JP] Japan .................................. 3-52097

[51] Int. Cl.[6] .................. H01L 49/00; H01L 29/68; H01L 27/02; H01L 29/78
[52] U.S. Cl. ........................ 257/371; 257/204; 257/206; 257/208; 257/296; 257/298; 257/300; 257/372; 257/373
[58] Field of Search ............... 357/23.6; 257/204, 206, 257/208, 296, 298, 300, 297, 371, 372, 373

[56] References Cited

U.S. PATENT DOCUMENTS

4,163,245  7/1979  Kinoshita ........................ 257/297
4,497,045  12/1985  Iizuka et al. ..................... 357/23.6

FOREIGN PATENT DOCUMENTS

0298421A2  1/1989  European Pat. Off. .
4121292A1  1/1992  Germany .

OTHER PUBLICATIONS

"A New Twin–Well CMOS Process Using Nitridized–Oxide–LOCOS (NOLOCOS) Isolating Technology," IEEE Electric Device Letters, vol. 10, No. 7, Jul. 1989, pp. 307–309.

"A 0.5$\mu$m Isolation Technology Using Advanced Poly Silicon Pad LOCOS (APPL)," IEEE IEDM 1988, pp. 100–103.

"An Advanced Half–Micrometer CMOS Device with Self–Aligned Retrograde Twin–Wells and Buried p+ Layer," VLSI Symposium, 1989, pp. 35–36.

*Primary Examiner*—Jerome Jackson
*Assistant Examiner*—Valencia Martin Wallace
*Attorney, Agent, or Firm*—Lowe, Price, LeBlanc & Becker

[57] ABSTRACT

A semiconductor memory device in accordance with the present invention includes a plurality of n well regions and p well regions in a p type silicon substrate. One of the p well regions is connected to an external power supply. Peripheries of the p well region having a memory cell array formed therein are surrounded by an n well region having a potential held at a positive potential. The n well region held at the positive potential prevents electrons introduced into the substrate due to undershoot from entering into a p well region through the p well region connected to the external power supply.

4 Claims, 16 Drawing Sheets

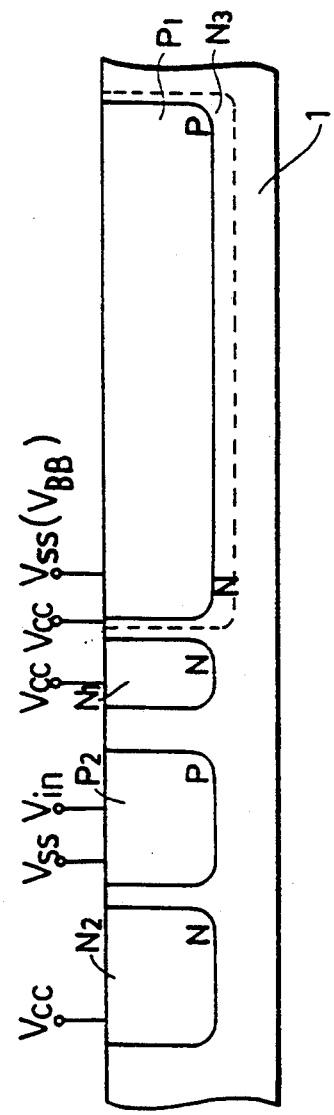
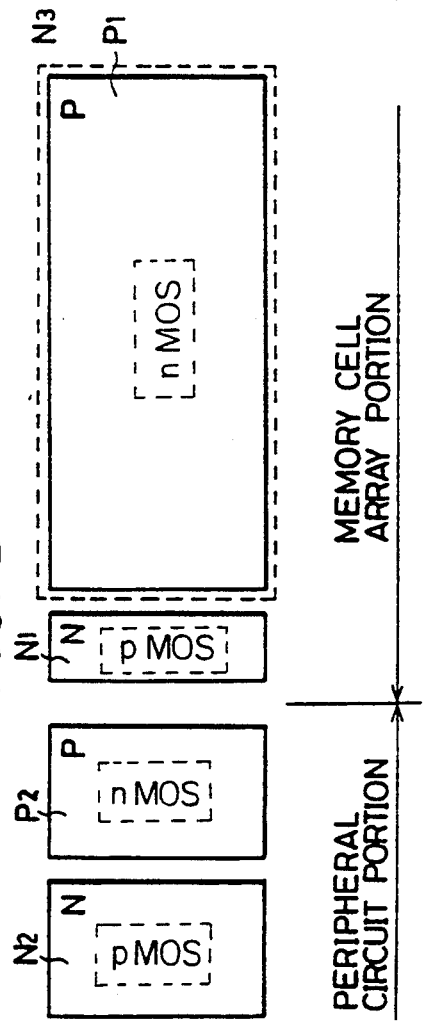

PERIPHERAL
CIRCUIT PORTION | MEMORY CELL ARRAY PORTION

PERIPHERAL CIRCUIT PORTION | MEMORY CELL ARRAY PORTION

SEMICONDUCTOR MEMORY DEVICE HAVING A PLURALITY OF WELL REGIONS OF DIFFERENT CONDUCTIVITIES

This application is a continuation of application Ser. No. 07/693,304, filed Apr. 30, 1991, now abandoned.

BACKGROUND OF THE INVENTION

1. Field of the Invention

The present invention relates to improvements of a well structure employed in semiconductor memory devices such as dynamic random access memories (DRAMs).

2. Description of the Background Art

FIG. 12 is a block diagram of the structure of a DRAM. A schematic structure of the DRAM will now be described with reference to FIG. 12. The DRAM generally includes a memory cell array portion serving as a storage region for storing a great deal of information and a peripheral circuit portion required for external inputs/outputs.

The memory cell array portion includes a memory cell portion 51 for storing data signals of the storage information, a row decoder 53 and a column decoder 54 for designating a memory cell constituting a unit storage circuit, and a sense refresh amplifier 55 for amplifying a signal stored in the designated memory cell, to read the amplified signal.

The peripheral circuit portion includes a row and column address buffer 52 for receiving an externally applied address signal for selecting memory cells, a data-in buffer 56 and a data-out buffer 57 employed for data inputs/outputs, a clock generator 58 for generating a clock signal, and the like.

FIG. 13 is a cross-sectional structural diagram schematically showing a well structure of the DRAM. A plurality of p well regions $P_1$ and $P_2$ and a plurality of n well regions $N_1$ and $N_2$ are formed in a p type silicon substrate 1. In the memory cell array portion, for example, nMOS switching transistors of memory cells or the like are, mainly formed in p well region $P_1$, and pMOS transistors of sense amplifiers or the like are formed in n well region $N_1$. In the peripheral circuit portion, similarly, nMOS transistors constituting various circuits are formed in p well region $P_2$, and pMOS transistors are formed in n well region $N_2$. p well regions $P_1$ and $P_2$ have their potentials held at a ground potential $V_{SS}$, and n well regions $N_1$ and $N_2$ have their potentials held at a supply potential $V_{CC}$.

The above-described well structure held at a predetermined potential has a problem of the occurrence of undershoot of an input signal at an input terminal. FIG. 14 is a diagram showing changes in the signal potential of an input signal Vin from an input terminal connected to p well region $P_2$ of FIG. 13. Referring to FIGS. 13 and 14, when the logic level of input signal Vin from the input terminal changes from a logic high level to a 0 level, there is a case where so-called undershoot occurs in which the potential of the input signal instantaneously decreases to a negative potential below the 0 level. In this case, in p well region $P_2$, a well potential is held at $V_{SS}(=0)$, so that if an input potential becomes a negative potential, a large number of electrons are instantaneously injected from the input terminal into silicon substrate 1. The electrons injected into the substrate flow into, for example, an adjacent p well region $P_1$ and further into a capacitor 12 of a memory cell through a source/drain region 11 formed in p well region $P_1$. Thus, the level of a logic high level signal stored in capacitor 12 changes to a logic low level, thereby destroying data.

This undershoot occurs not only at the input terminal but also at internal input terminals of a peripheral circuit or a decoder and a sense amplifier.

In order to avoid such undershoot, a method is provided, for example, in which the potential of a p well region is set to a negative potential $V_{BB}$ which allows for more margins as compared with the potential for undershoot. Such a state that the potential of the p well region is set to the negative potential is shown in FIG. 15. FIG. 15 is a cross-sectional structural view of a semiconductor memory device corresponding to FIG. 13. p well region $P_1$ of the memory cell array portion and p well region $P_2$ of the peripheral circuit portion are each held at the negative potential $V_{BB}$. Holding p well regions $P_1$ and $P_2$ at the negative potential $V_{BB}$ can prevent the injection of electrons from the input terminal even if undershoot from the input terminal is developed, and can also prevent data destruction of memory cells or the like. In this method, however, a new problem occurs in which the characteristics of an nMOS transistor formed in a well region set in the negative potential $V_{BB}$ are deteriorated. That is, if a gate length of the MOS transistor formed in this well region set in the negative potential $V_{BB}$ is reduced, then a decrease in a threshold voltage depending on the gate length becomes significant as compared with the case where the well potential is set to $V_{SS}$, and a decrease in a breakdown voltage developed across the source and the drain becomes significant. Accordingly, with the capacity of the DRAM becoming larger and the structure thereof becoming smaller, the characteristics of MOS transistors become significantly deteriorated. It is thus difficult to set the potential of the p well region to the negative potential $V_{BB}$.

SUMMARY OF THE INVENTION

One object of the present invention is to prevent injection of electrons into well regions due to an undershoot phenomenon, in a semiconductor memory device having a plurality of well regions.

Another object of the present invention is to apply a potential, suitable for the characteristics of a semiconductor element formed in each well region, to the well region.

A further object of the present invention is to provide a method of manufacturing a semiconductor memory device having a plurality of well regions.

A semiconductor memory device in accordance with the present invention includes: a p type semiconductor substrate having a main surface and including a memory cell array region in which a memory cell array, including a memory cell portion having a plurality of memory cells arranged on the main surface and a circuit portion connected to the memory cell portion and performing an access operation for writing/reading storage information, is formed, and a peripheral circuit region in which circuit portions other than the memory cell array region are formed; a first p well region formed in the semiconductor substrate in the peripheral circuit region and connected to an input terminal for receiving an external input signal, the first p well region having a potential held at a ground potential; a first n well region formed in the semiconductor substrate in the peripheral circuit region and having a potential held at a supply potential; a second p well region formed in the semiconductor substrate in the memory cell array region and having a potential held at a negative potential or the ground potential; and a second n well region formed in the semiconductor substrate in the memory cell array region and having a potential held at the supply potential. According to a first aspect of the present invention, a third n well region having a potential held at the supply potential is formed in the semiconductor substrate to surround the second p well region.

According to a second aspect of the present invention, the third n well region is formed in the semiconductor substrate to surround the second p well region and the second n well region and has its potential held at the supply potential.

According to a third aspect of the present invention, the third n well region is formed in the semiconductor substrate to surround the first p well region and has its potential held at the supply potential.

According to a fourth aspect of the present invention, the third n well region is formed in the semiconductor substrate to surround the first p well region and the first n well region and has its potential held at the supply potential.

In a well structure of the semiconductor memory device in accordance with the present invention, peripheries of the p well region are surrounded by the third n well region having its potential held at the supply potential. A junction-forming of the third n well region between the p type substrate and the p well region to be protected enables the potential of the p well region to be held at the ground potential or the negative potential. The third n well region absorbs electrons injected into the substrate due to undershoot, to prevent the injected electrons from reaching a capacitor of a memory cell formed in, for example, the p well region.

A semiconductor memory device in accordance with the present invention includes first and second well regions of a second conductivity type formed independently of each other in a semiconductor substrate of a first conductivity type, and a third well region of the first conductivity type formed in the second well region. A method of manufacturing such a semiconductor memory device includes the steps of: first covering a predetermined region on a surface of a semiconductor substrate with a thermal oxidation film, then ion-implanting second conductivity type impurities into the semiconductor substrate with the thermal oxidation film serving as a mask, and subjecting the resultant film to a thermal diffusion processing, so as to form a second well region; removing the thermal oxidation film and then forming a first mask pattern having an opening in a predetermined position on a main surface of the semiconductor substrate; ion-implanting first conductivity type impurities into the semiconductor substrate plural times by utilizing the first mask pattern, so as to form a third well region having a predetermined impurity profile; forming a second mask pattern having a predetermined form covering the surface of the second well region; and ion-implanting second conductivity type impurities into the semiconductor substrate plural times by utilizing the second mask pattern, so as to form a first well region having a predetermined impurity profile.

In the manufacture method of the semiconductor memory device in accordance with the present invention, in the formation of well regions having a double structure, if a second conductivity type well region to be formed outside is formed by thermal diffusion, and a first conductivity type well region to be formed in the second conductivity type well region is formed by ion implantation, then a well structure, requiring fewer thermal processing steps and having an excellent controllability with respect to impurity profiles in the well regions, can be formed.

The foregoing and other objects, features, aspects and advantages of the present invention will become more apparent from the following detailed description of the present invention on when taken in conjunction with the accompanying drawings.

BRIEF DESCRIPTION OF THE DRAWINGS

FIGS. 1A and 1B are a cross-sectional structural view showing a well structure of a DRAM according to a first embodiment of the present invention, and a planar structural view thereof, respectively;

DESCRIPTION OF THE PREFERRED EMBODIMENTS

A first embodiment of the present invention will now be described. FIGS. 1A and 1B schematically illustrate a p well region $P_1$ and an n well region $N_1$ included in a memory cell array portion and a p well region $P_2$ and an n well region $N_2$ included in a peripheral circuit portion. In the memory cell array portion, memory cells or the like including nMOS transistors are formed in p well region $P_1$, and pMOS transistors or the like constituting sense amplifiers or the like are formed in n well region $N_1$. In the peripheral circuit portion, similarly, circuits including nMOS transistors or the like are constructed in p well region $P_2$, and circuits including pMOS transistors are constructed in n well region $N_2$. p well region $P_1$ in the memory cell array portion is connected to a negative potential $V_{BB}$ ($=:-1.5$ V) or a ground potential $V_{SS}$ ($=0$ V). n well region $N_1$ has its potential held at a supply potential $V_{CC}$ ($=+3.3$ V). Peripheries of p well region $P_1$ are covered with an n well region $N_3$. This n well region $N_3$ is connected to supply potential $V_{CC}$. p well region $P_2$ in the peripheral circuit portion has its potential held at ground potential $V_{SS}$ ($=0$ V), and n well region $N_2$ has its potential held at supply potential $V_{CC}$ ($=+3.3$ V). In this state, a p type silicon substrate 1 is held at ground potential $V_{SS}$. There is also a case where a positive potential, which is obtained by voltage-dropping supply potential $V_{CC}$ by employing an internal voltage drop circuit, is applied to n well regions $N_1$ and $N_3$ from the view point of a design with respect to power consumption or a reliability with respect to hot carriers, drain leakage and the like. There is another case where different supply potentials $V_{CC}$ are applied to n well regions $N_1$ and $N_3$. For example, n well region $N_3$ is connected to an external supply potential $V_{CC}$ ($=+3.3$ V), and n well region $N_1$ is connected to an internal supply potential $V_{CC}$ ($=+2.5$ V).

In the present case where n well region $N_3$ surrounds p well region $P_1$ in which memory cells of the memory cell array portion are formed, even if undershoot occurs at an input terminal, the injection of electrons into p well region $P_1$ and also the destruction of storage data in the memory cells are prevented.

Figure 2:
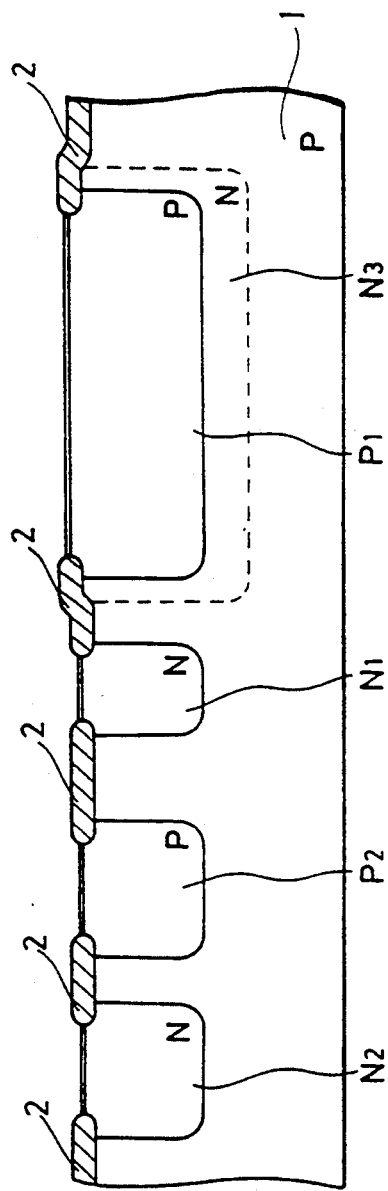
FIG. 2 is a cross-sectional structural view showing a more specific well structure of the DRAM shown in FIG. 1A.

FIG. 2 shows the well structure of FIG. 1A in more detail. Field oxide films 2 for element isolation are formed on adjacent surfaces of the respective well regions. Various circuits such as of memory cells, sense amplifiers, decoders or buffers are constructed on respective surfaces of the well regions surrounded by field oxide films 2. These well regions $P_1$, $P_2$, $N_1$ and $N_2$ are shown conceptually. Micro patterns for element isolation, active regions or well regions are formed in respective well surface regions.

A description will now be given on the manufacture steps of the well structure of the DRAM shown in FIG. 2.

Figure 3A:
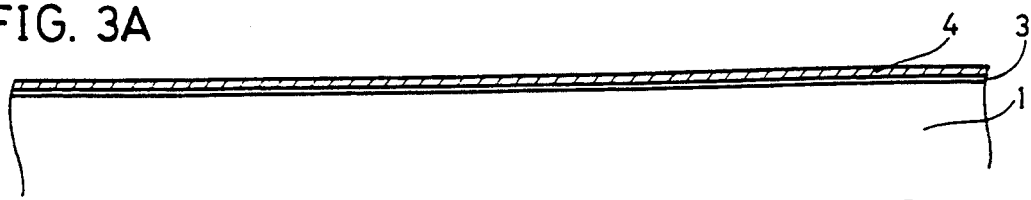
FIGS. 3A, 3B, 3C, 3D, 3E, 3F, 3G, 3H and 3I are cross-sectional views showing the steps of manufacturing the well structure of the DRAM of FIG. 2.

First, referring to FIG. 3A, an underlying oxide film 3 and a nitride film 4 are formed on a surface of a p type silicon substrate 1.

Figure 3B:
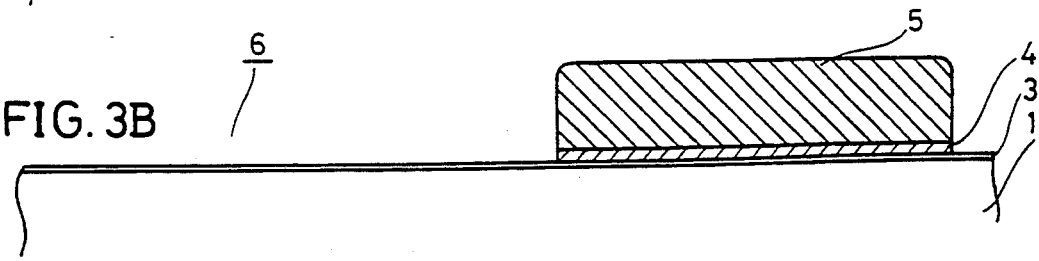

Then, as shown in FIG. 3B, a resist 5 is applied onto the surface of nitride film 4, and then a resist pattern 5 and a nitride film pattern 4 are formed by employing lithography and an etching process. At this time, an exposed region of the surface of underlying oxide film 3 is a peripheral circuit region 6.

Figure 3C:
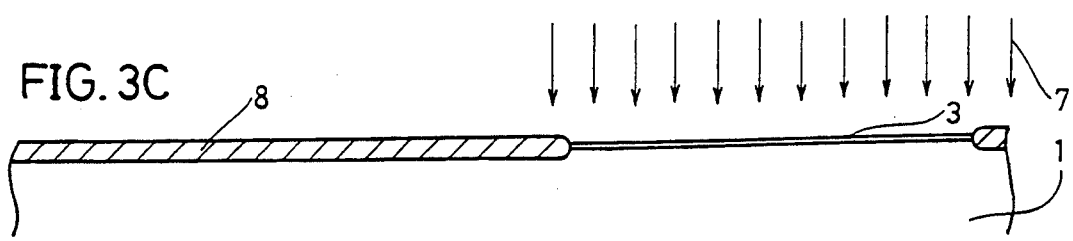

Referring to FIG. 3C, after resist pattern 5 is removed, a thermal oxidation is carried out with nitride film 4 serving as an oxidation-resistant mask. Thus, a thermal oxidation film 8 is formed in peripheral circuit region 6 on the surface of p type silicon substrate 1. After nitride film 4 is removed, phosphorus ions 7 are implanted onto a memory cell array region of silicon substrate 1 at a dose of $10^{12}-10^{13}$ cm$^{-2}$ with thermal oxidation film 8 serving as a mask.

Figure 3D:
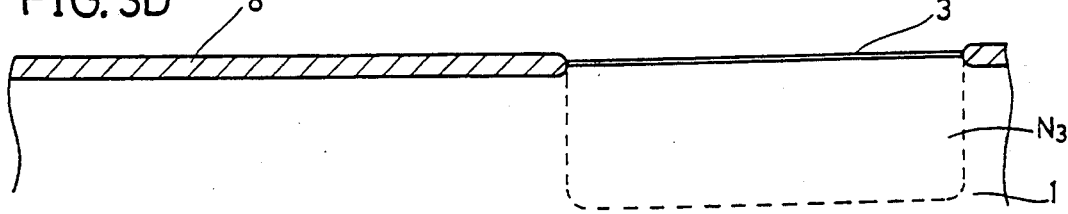
Figure 4:
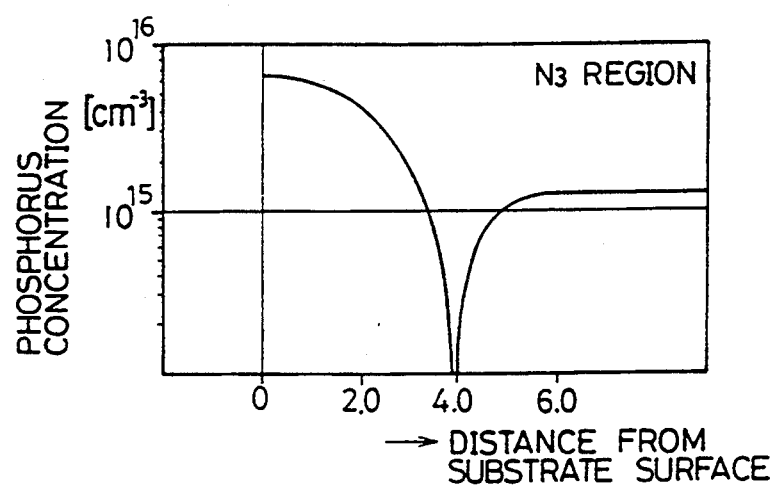
FIG. 4 is a diagram showing an impurity profile of an n well region $N_3$ in the step shown in FIG. 3D.

Then, as shown in FIG. 3D, a thermal diffusion processing is carried out at a temperature of 1100°-1200° C. over several hours, thereby forming an n well region $N_3$. An impurity profile of n well region $N_3$ formed by the thermal diffusion is shown in FIG. 4. FIG. 4 is a concentration distribution diagram in which an abscissa indicates a distance as a function of depth from the surface of p type silicon substrate 1, and an ordinate indicates phosphorus concentration. n well region $N_3$ formed by the thermal diffusion has an impurity profile which decreases gradually as a function of depth into the substrate.

Figure 3E:
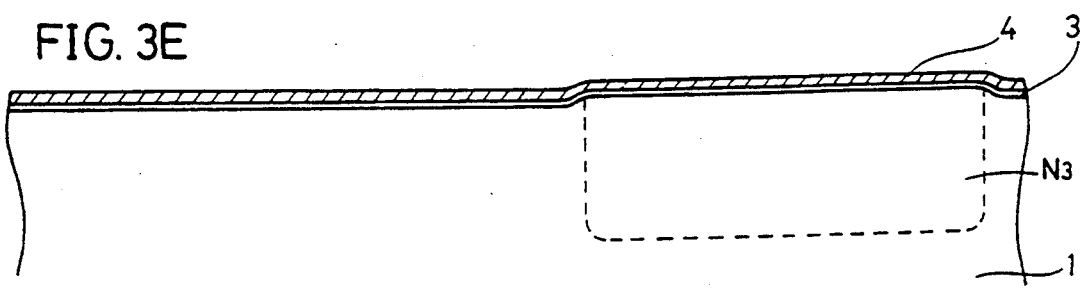

Then, referring to FIG. 3E, after removal of thermal oxidation film 8 and underlying oxide film 3 formed on the surface of n well region $N_3$, underlying oxide film 3 and nitride film 4 are again formed over the entire surface of silicon substrate 1.

Figure 3F:
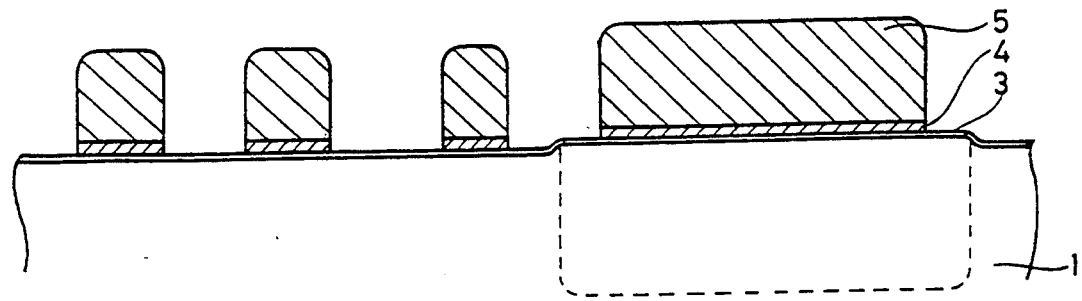

A resist pattern 5 having openings in a region to be an element isolation region, and a nitride film 4 are formed by employing a lithography process and an etching process, as shown in FIG. 3F.

Figure 3G:
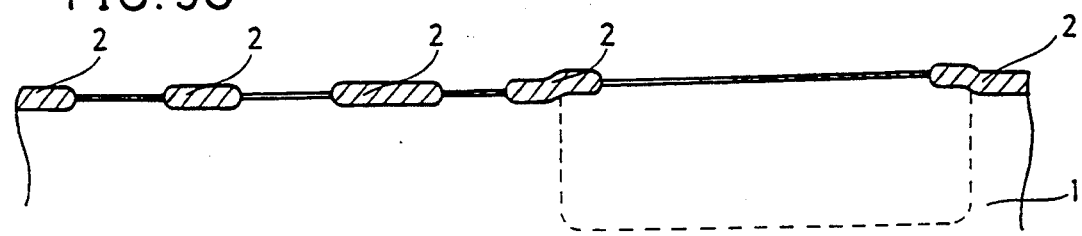

As shown in FIG. 3G, after removal of resist pattern 5, a thermal oxidation processing is carried out with nitride film 4 serving as a mask, thereby forming a field oxide film 2 having a large thickness in the isolation region on the surface of the silicon substrate. Nitride film 4 is thereafter removed.

Figure 3H:
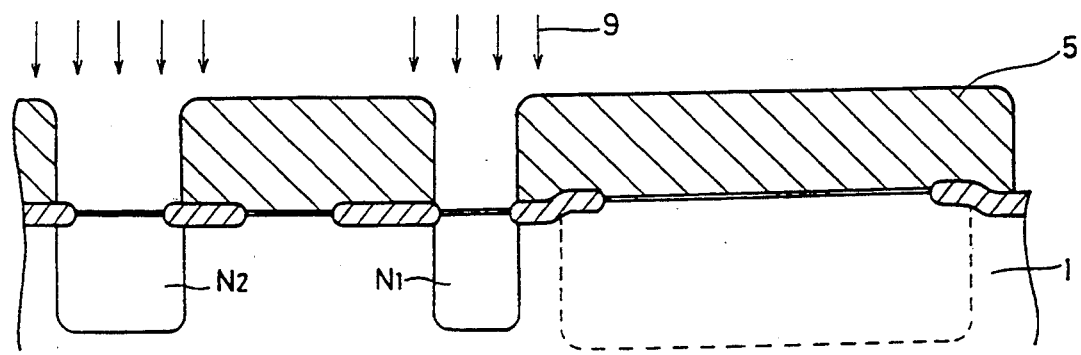
Figure 3I:
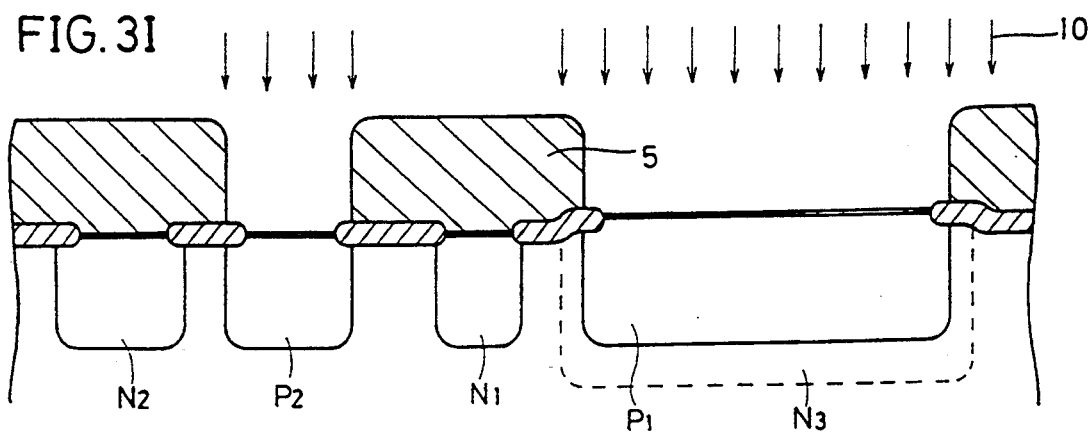
Figure 5:
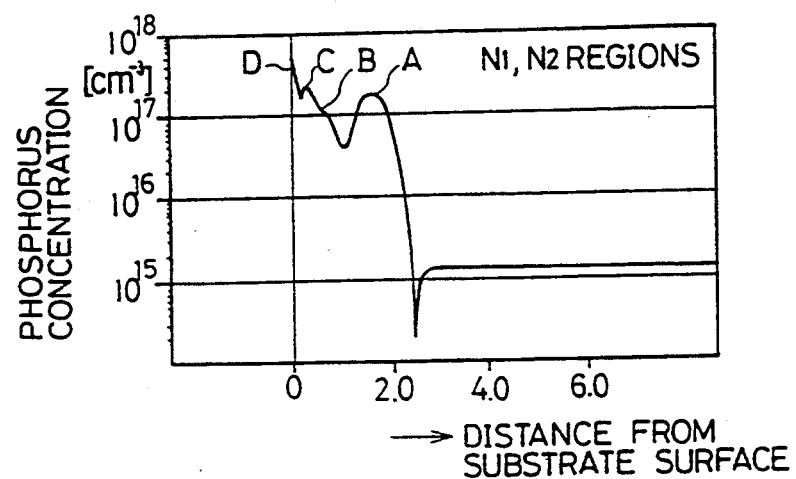
FIG. 5 is a diagram showing an impurity profile of n well regions $N_1$ and $N_2$ in the step shown in FIG. 3H.
Figure 6:
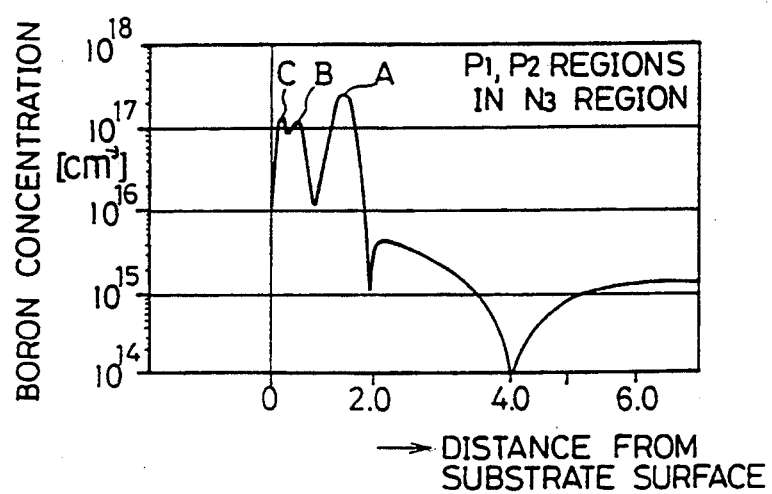
FIG. 6 is a diagram showing an impurity profile of a p well region $P_1$ in the step shown in FIG. 3I.
Figure 7:
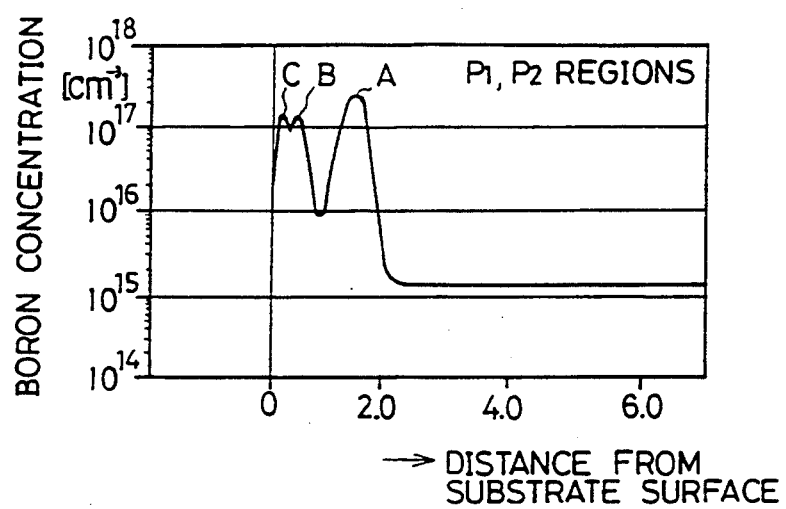
FIG. 7 is a diagram showing an impurity profile of a p well region $P_2$.
Figures 8A, 8B:
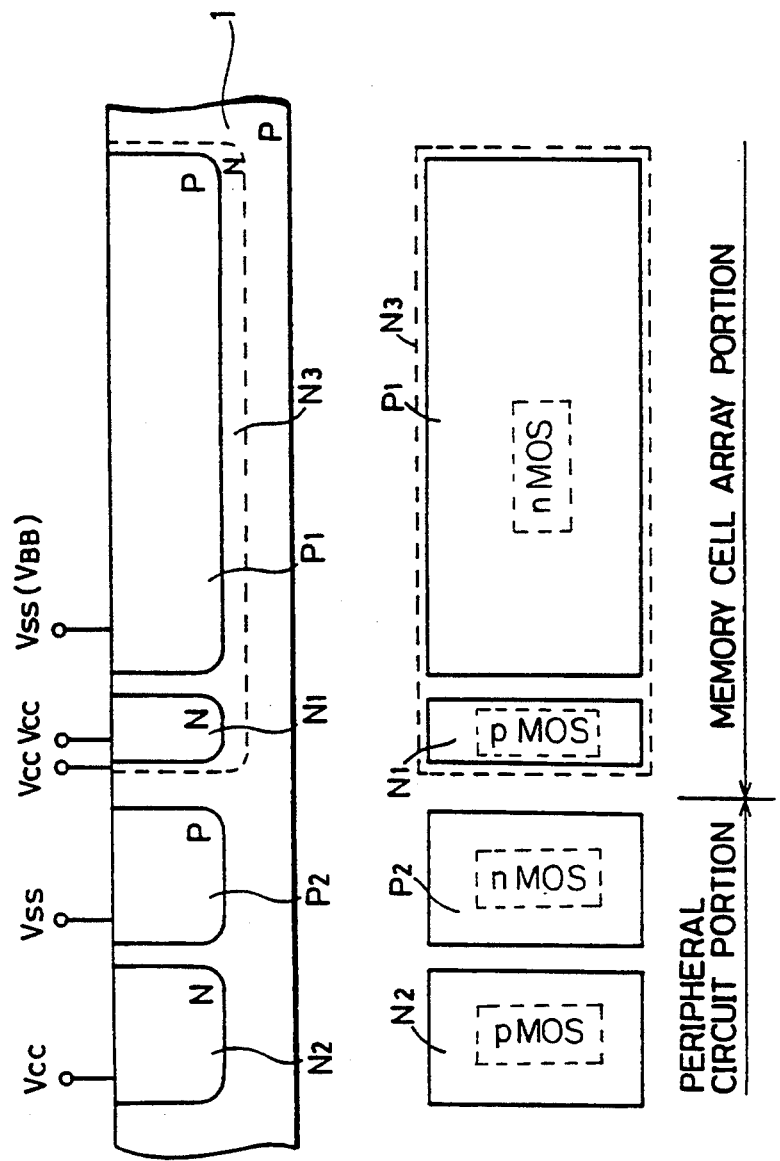
FIGS. 8A and 8B are a cross-sectional structural view of a well structure according to a second embodiment of the present invention, and a planar structural view thereof, respectively.

Referring to FIG. 3H, after a resist 5 is applied onto the surface of silicon substrate 1, a resist pattern 5 having openings only in regions where n well regions are to be formed is formed by patterning. After that, impurity ions 9 are implanted onto the surface of silicon substrate 1 with resist pattern 5 serving as a mask through plural steps of ion implantation, so as to form an n well region $N_1$ in a memory cell array portion and an n well region $N_2$ in a peripheral circuit portion. FIG. 5 is an impurity profile diagram of n well regions $N_1$ and $N_2$ formed through the ion implantations steps. In FIG. 5, an abscissa indicates a distance as a function of depth from the surface of silicon substrate 1, and an ordinate indicates phosphorus concentration. A well structure having such an impurity profile is called a retrograde well. Ion implantation steps for formation of this well will now be described with reference to the concentration distribution diagram of FIG. 5. In a first ion implantation step, phosphorus ions are implanted at an implantation energy of 1 to 1.5MeV, at a dose of $1.0 \times 10^{13}$ to $1.0 \times 10^{14}$ cm$^{-2}$, so as to form a first peak A of FIG. 5. A second phosphorus ion implantation is carried out at an implantation energy of 350 to 500 keV, at a dose of 2.0 to $8.0 \times 10^{12}$ cm$^{-2}$, so as to form a second peak B. A third phosphorus ion implantation is carried out at an implantation energy of 120 to 200 keV, at a dose of 2.0 to $8.0 \times 10^{12}$ cm$^{-2}$, so as to form a third peak C. Furthermore, boron ions are implanted as counter dose at an implantation energy of 20 to 50 keV, at a dose of $1.0 \times 10^{11}$ to $1.0 \times 10^{13}$ cm$^{-2}$, so as to form a fourth peak D. As shown in FIG. 3I, after removal of resist pattern 5, a resist pattern 5 is formed which has openings on the surface of regions to be p well regions $P_1$ and $P_2$ and on the surface of n well region $N_3$ of the memory cell array portion. Then, impurity ions 10 are implanted into silicon substrate 1 with this resist pattern 5 serving as a mask, so as to form p well regions $P_1$ and $P_2$ of the same retrograde type as the one described above. A first boron ion implantation is carried out at an implantation energy of 500 to 100 keV at a dose of $1.0 \times 10^{13}$ to $1.0 \times 10^{14}$ cm$^{-2}$, so as to form a first peak A of FIGS. 6 and 7. A second boron ion implantation is carried out at an implantation energy of 120 to 200 keV, at a dose of 2.0 to $8.0 \times 10^{12}$ cm$^{-2}$, so as to form a second peak B. A third boron ion implantation is carried out at an implantation energy of 20 to 50 keV, at a dose of $1.0\times10^{11}$ to $1.0\times10^{13}$ cm$^{-2}$, so as to form a third peak C.

Resist pattern 5 is thereafter removed. The well structure shown in FIG. 2 is thus obtained through the foregoing steps. As described above, n well region $N_3$ formed in the memory cell array portion is formed by the thermal diffusion processing, while other n well regions $N_1$ and $N_2$ and p well regions $P_1$ and $P_2$ are formed with the retrograde well structure by plural times of the ion implantation. In this retrograde well structure, a high concentration layer contributing to a prevention against a latch-up phenomenon is formed mainly by a first ion implantation; a high concentration layer for preventing an inversion is formed beneath field oxide film 2 by a second ion implantation; and a concentration setting for inhibiting a punch through of a MOS transistor or for controlling a threshold voltage is carried out by a third ion implantation. Provision of such a structure can suppress a narrow channel effect of MOS transistors formed on well regions and can realize a well structure having an excellent controllability for a threshold voltage.

Figure 9:
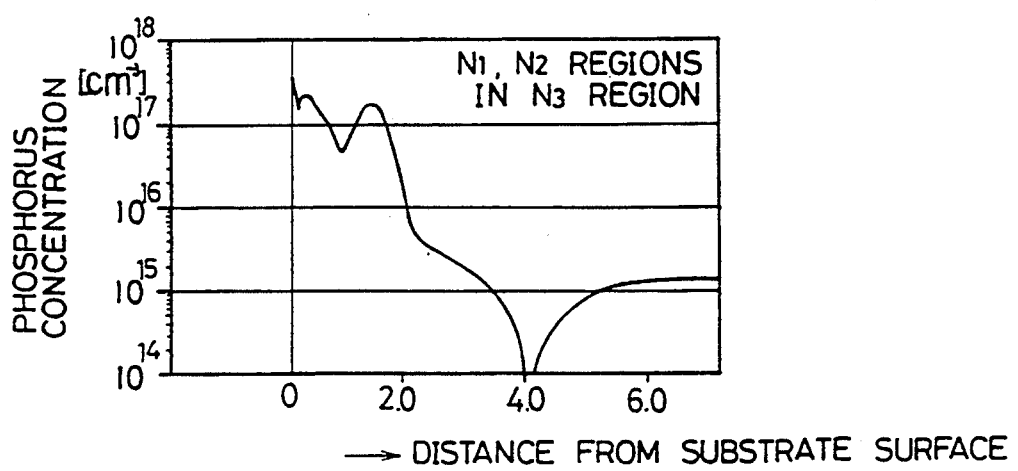
FIG. 9 is a diagram showing an impurity profile of an n well region $N_1$ of FIG. 8A.

A second embodiment of the present invention will now be described. In the second embodiment, both p well region $P_1$ and n well region $N_1$ in the memory cell array portion are covered with n well region $N_3$. p well region $P_1$ has its potential held at negative potential $V_{BB}$ or ground potential $V_{SS}$, and n well region $N_3$ has its potential held at supply potential $V_{CC}$. FIG. 9 is an impurity profile diagram of n well region $N_1$ included in this memory cell array portion. This n well region $N_1$ also has the retrograde well structure formed by plural times of ion implantation. In this second embodiment also, p well region $P_1$ where memory cells are formed is surrounded by n well region $N_3$, so that p well region $P_1$ has its potential maintained at a predetermined negative potential $V_{BB}$ or ground potential $V_{SS}$ and is protected from injection of electrons due to undershoot.

Figure 10A:
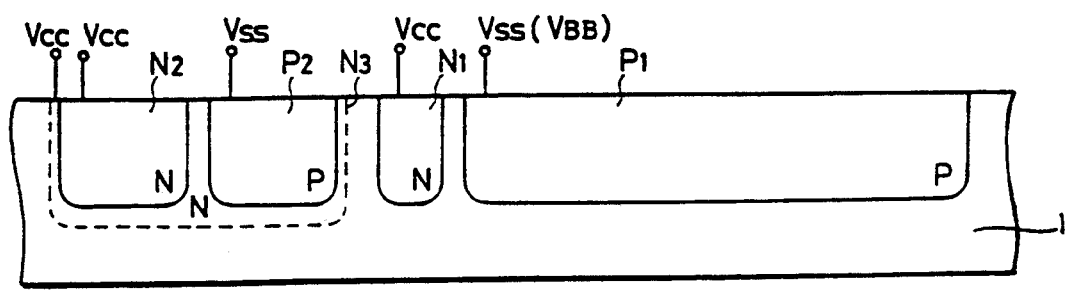
FIGS. 10A and 10B are a cross-sectional structural view of a well structure according to a third embodiment of the present invention, and a planar structural view thereof, respectively.
Figure 10B:
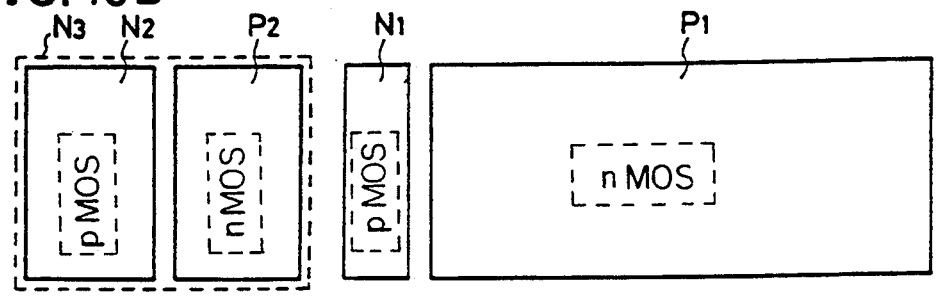

A third embodiment of the present invention will now be described. In the third embodiment shown in FIGS. 10A and 10B, an n well region $N_3$ connected to a supply potential $V_{CC}$ is formed to surround the peripheries of a p well region $P_2$ and n well region $N_2$ in a peripheral circuit portion. This provides an effect than n well region $N_3$ captures injected electrons due to undershoot occurring in p well region $P_2$ in the peripheral circuit portion, so as to prevent the flow of the electrons into the silicon substrate and also provides another effect that p well region $P_2$ has ills potential held at ground potential $V_{SS}$ and p well region $P_1$ of the memory cell array portion has its potential held at negative potential $V_{BB}$ or ground potential $V_{SS}$.

Figure 11A:
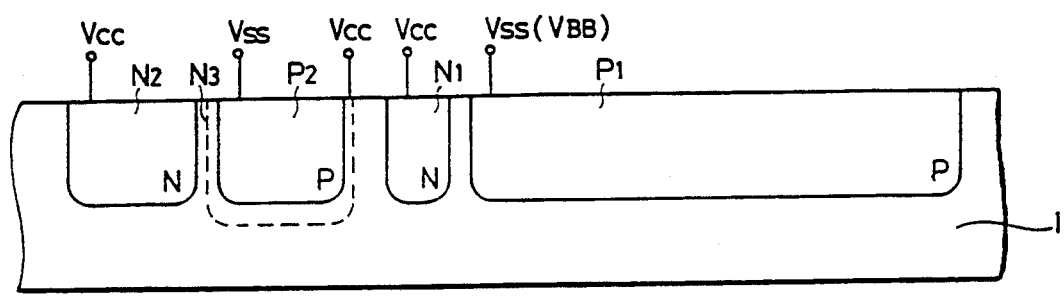
FIGS. 11A and 11B are a cross-sectional structural view of the well structure according to the third embodiment of the present invention, and a planar structural view thereof, respectively.
Figure 11B:
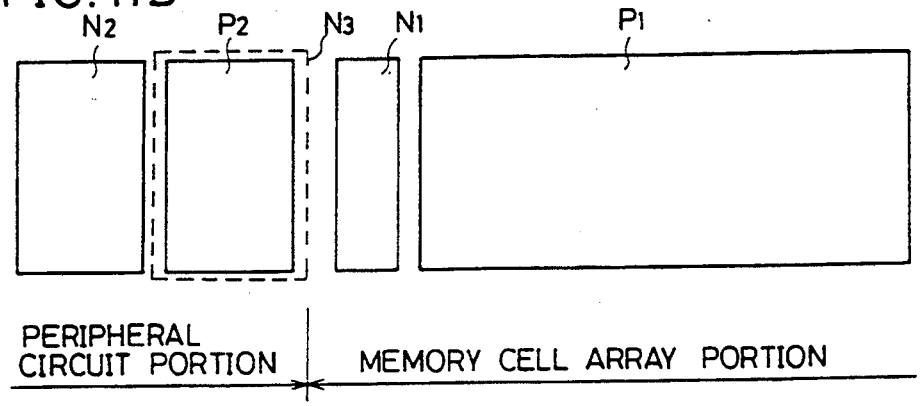
Figure 12:
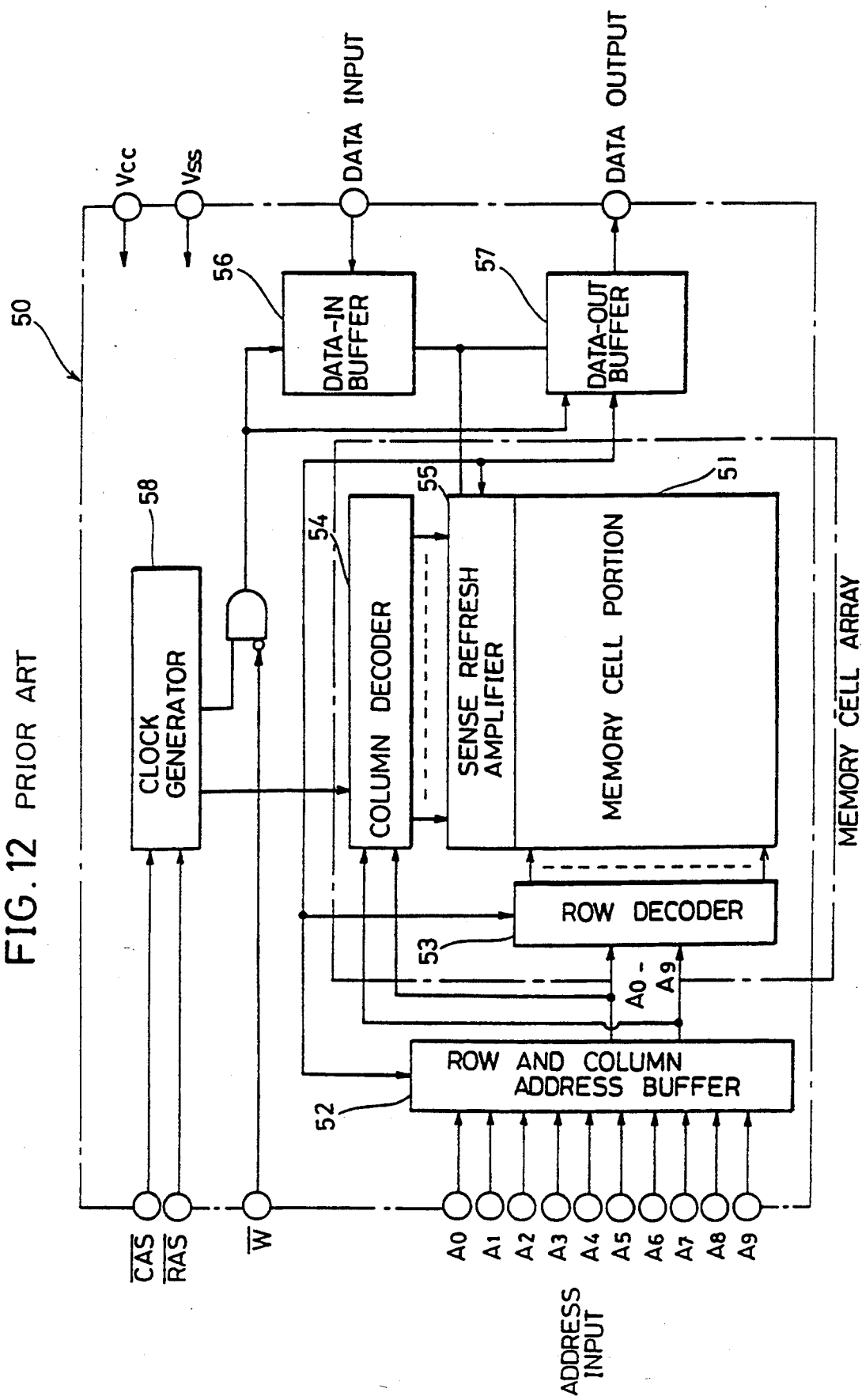
FIG. 12 is a block diagram showing the structure of a general DRAM.
Figure 13:
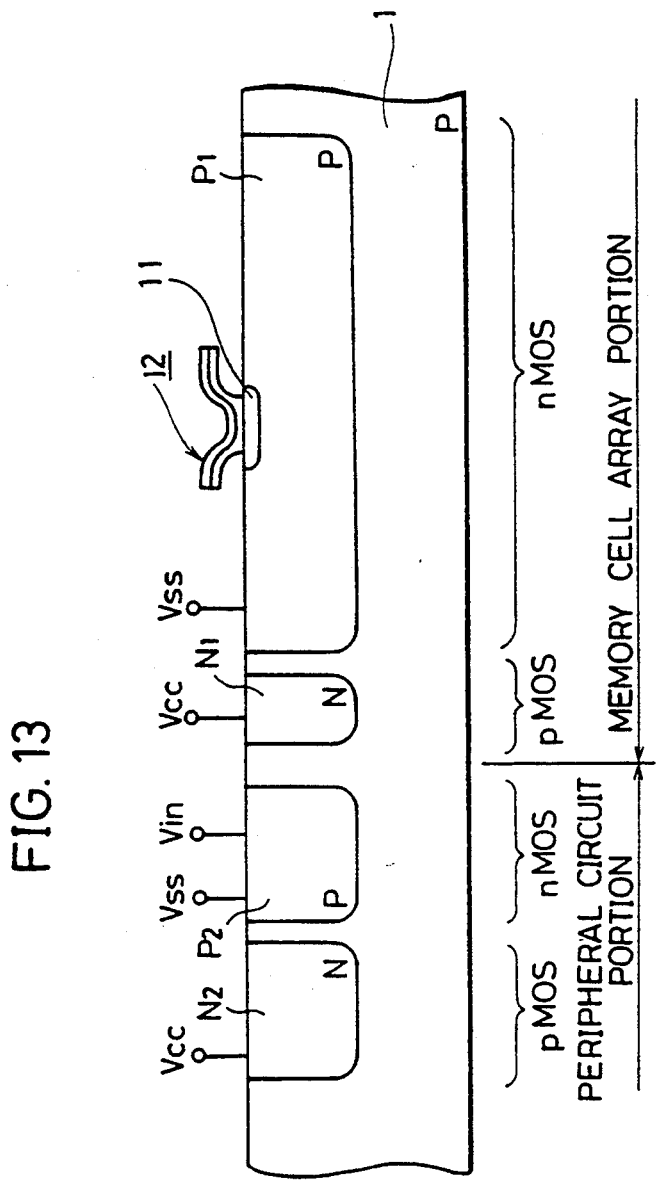
FIG. 13 is a cross-sectional structural view schematically showing a well structure of a conventional DRAM.
Figure 14:
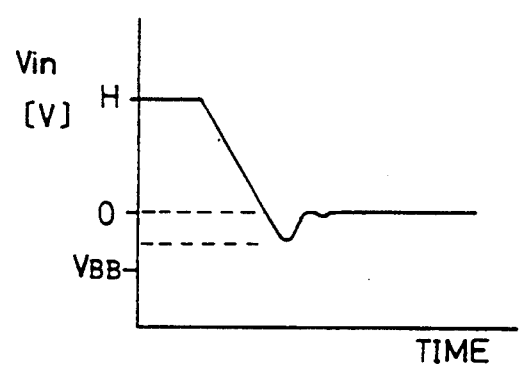
FIG. 14 is a diagram showing input potential changes illustrating the state of undershoot at an input terminal.
Figure 15:
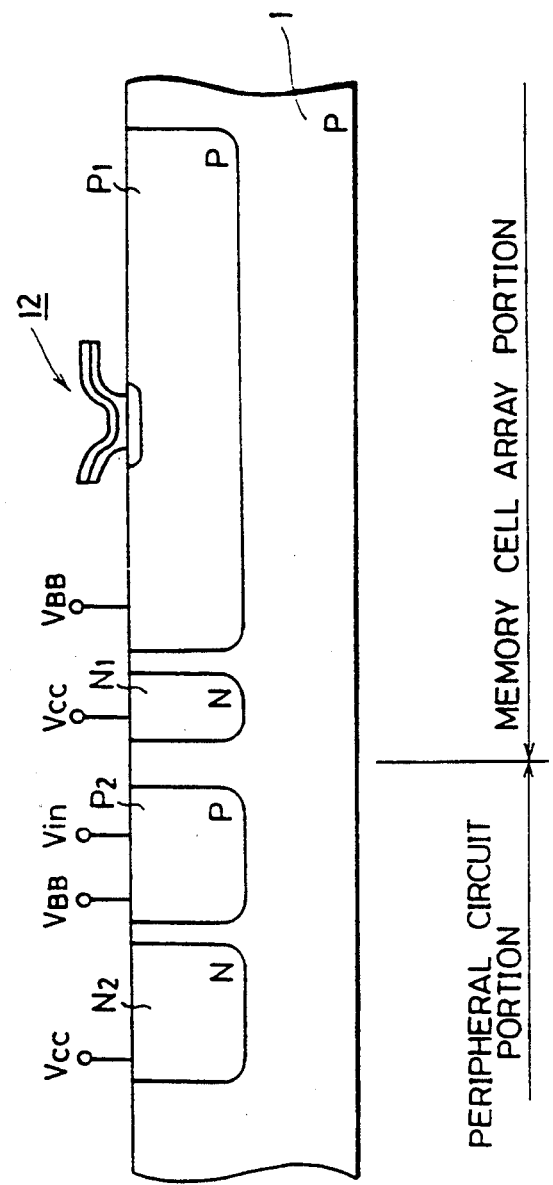
FIG. 15 is a cross-sectional structural view of a well structure of a conventional DRAM showing another example.

A fourth embodiment of the present invention is shown in FIGS. 11A and 11B. The fourth embodiment is a variation of the third embodiment, in which only the peripheries of p well region $P_2$ in the peripheral circuit portion are covered with n well region $N_3$. This case also provides the same effect as that of the third embodiment.

As another variation of the third embodiment, such an example is provided that p well region $P_2$ and n well region $N_2$ in the peripheral circuit portion are of a diffusion type well structure. This thermal diffusion type well structure has such an advantage that excellent element isolation characteristics are provided even in regions having isolation films with different thicknesses. The structure, however, has such a disadvantage that a narrow channel effect due to diffusion of impurities from a channel stopper layer for element isolation is generated. Accordingly, in a peripheral circuit portion in which a relatively large channel width can be provided, only this peripheral circuit portion can employ the thermal diffusion type well structure in view of the advantage of the excellent element isolation characteristics.

While the employment of the p type silicon substrate has been described in the foregoing embodiments, the present invention is also applicable to the case with an n type silicon substrate.

As has been mentioned above, the provision of a double well structure in which an n well region having its potential held at a positive potential is formed in peripheries of a p well region makes it possible to provide a semiconductor memory device in which adverse influences such as undershoot are inhibited and degradations in transistor characteristics occur, and a method of manufacturing such a semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a p type semiconductor substrate having a main surface and including a memory cell array region in which a memory cell array, including a memory portion having a plurality of memory cells and associated memory active elements arranged on the main surface and a circuit portion having a plurality of peripheral active elements connected to the memory cell portion and performing an access operation for writing/reading storage information, is formed, and a peripheral circuit region in which circuit portions other than said memory cell array are formed;
   a first p well region formed in said semiconductor substrate in said peripheral circuit region so as to surround a first set of said peripheral active elements and connected to an input terminal for receiving an external input signal, and having a potential held at a ground potential;
   a first n well region formed in said semiconductor substrate in said peripheral circuit region so as to surround a second set of said peripheral active elements and having a potential held at a positive potential;
   a second p well region formed in said semiconductor substrate in said memory cell array region so as to surround a first set of said memory cells and associated memory active elements and having a potential held at one of a negative potential and the ground potential;
   a second n well region formed in said semiconductor substrate in said memory cell array region so as to surround a second set of said memory cells and associated memory active elements and having a potential held at the positive potential; and
   a third n well region formed in said semiconductor substrate to surround said second p well region and said second n well region and having a potential held at the positive potential, said third n well region being doped differently from said second n region.

2. A semiconductor memory device, comprising:

a p type semiconductor substrate having a main surface and including a memory cell array region in which a memory cell array, including a memory cell portion having a plurality of memory cells and associated memory active elements arranged on the main surface and a circuit portion having a plurality of peripheral active elements connected to the memory cell portion and performing an access operation for writing/reading storage information, is formed, and a peripheral circuit region in which circuit portions other than said memory cell array are formed;

a first p well region formed in said semiconductor substrate in said peripheral circuit region so as to surround a first set of said peripheral active elements and connected to an input terminal for receiving an external input signal, and having a potential held at a ground potential;

a first n well region formed in said semiconductor substrate in said peripheral circuit region so as to surround a second set of said peripheral active elements and having a potential held at a positive potential;

a second p well region formed in said semiconductor substrate in said memory cell array region so as to surround a first set of said memory cells add associated memory active elements and having a potential held at one of a negative potential and the ground potential;

a second n well region formed in said semiconductor substrate in said memory cell array region so as to surround a second set of said memory cells and associated memory active elements and having a potential held at the positive potential; and a third n well region formed in said semiconductor substrate to surround said first p well region and said first n well region and having a potential held at the positive potential, said third n well region being doped differently from said first n region.

3. The device of claim 1, wherein said second p well region and said second n well region are separated from each other.

4. The device of claim 2, wherein said first p well region and said first n well region are separated from each other.

* * * * *